United States Patent [19] | [11] Patent Number: 4,571,611
Kashiwagi | [45] Date of Patent: Feb. 18, 1986

[54] SEMICONDUCTOR CHIP WITH A METAL HEAT RADIATOR

[75] Inventor: Shunji Kashiwagi, Yokohama, Japan

[73] Assignee: Fujitsu Limited, Kawasaki, Japan

[21] Appl. No.: 480,588

[22] Filed: Mar. 30, 1983

[30] Foreign Application Priority Data

Mar. 31, 1982 [JP] Japan .................. 57-53124

[51] Int. Cl.$^4$ .......................... H01L 5/00; H01L 3/00
[52] U.S. Cl. ...................................... 357/81; 361/388
[58] Field of Search ................... 357/68, 81; 361/386, 361/387, 388, 389

[56] References Cited

U.S. PATENT DOCUMENTS 3,588,632  6/1971  Nakata ................................. 357/81
3,723,833  3/1973  Wheatley, Jr. ..................... 357/81
3,820,153  6/1974  Quinn ................................. 357/81
4,107,727  8/1978  Ikezawa et al. .................. 357/68
4,361,720  11/1982  Resneau et al. ................. 357/81

FOREIGN PATENT DOCUMENTS 96559  6/1982  Japan ................................. 357/81

Primary Examiner—William L. Sikes
Assistant Examiner—Frank González
Attorney, Agent, or Firm—Staas & Halsey

[57] ABSTRACT

A semiconductor chip, including a semiconductor substrate and a radiator plate. An active region is formed on one main surface of the semiconductor substrate. The radiator plate is bonded to the other main surface side of the semiconductor substrate. A recess is formed on the other main surface side so as to dispose the radiator plate therein.

8 Claims, 7 Drawing Figures

SEMICONDUCTOR CHIP WITH A METAL HEAT RADIATOR

BACKGROUND OF THE INVENTION

The present invention relates to the structure of a semiconductor chip which comprises a semiconductor substrate and a metal radiator provided on the rear surface of the semiconductor substrate.

As illustrated in FIG. 1, a metal radiator plate 4 is bonded to the rear surface of the semiconductor substrate of a semiconductor chip which generates a large amount of heat. In FIG. 1, numeral 1 designates a semiconductor chip, numeral 2 designates a semiconductor substrate, numeral 3 designates an active region, and numeral 4 designates a radiator plate. Such a semiconductor chip 1 is housed within a package (not shown) so that it constitutes a semiconductor device.

The radiator plate 4 is bonded to the semiconductor substrate 2 at a high temperature. When the semiconductor substrate 2 is restored to room temperature after bonding, as illustrated in FIG. 2A, the radiator plate and the semiconductor substrate 2 are convexly curved or twisted due to the difference between the coefficient of heat expansion of the radiator plate 4 and that of the semiconductor substrate 2. The semiconductor chip 1 is made of silicon (Si) or gallium-arsenic (GaAs). The coefficient ($\alpha$) of heat expansion of silicon is $2.4 \times 10^{-6}$ (in cm/oc, throughout). The coefficient ($\alpha$) of heat expansion of gallium-arsenic is $6.9 \times 10^{-6}$. The radiator plate 4 is made of copper (Cu) or silver (Ag). The coefficient ($\alpha$) of heat expansion of copper is approximately $16.7 \sim 20 \times 10^{-6}$. The coefficient ($\alpha$) of heat expansion of silver is about $19 \sim 20.5 \times 10^{-6}$. Such deformation of the semiconductor chip 1 causes the semiconductor chip 1 to have unstable characteristic and causes the semiconductor substrate thereof to crack. Furthermore, the semiconductor chip 1 cannot be reliably handled with a vacuum chuck since the surface of the semiconductor substrate 2 is also curved.

Also, as illustrated in FIG. 2B, when a heat treatment is carried out, to bond the semiconductor chip 1 to the package 5, the semiconductor chip is concavely curved due to the difference between the coefficient of heat expansion of the semiconductor substrate 2 and that of the radiator plate 4. This hinders a tight contact between the semiconductor chip 1 and the package 5 so that the efficiency of heat radiation is degraded. Numeral 6 designates solder for securing the chip 1 to the package 5.

The dimension of a semiconductor chip 1 having a high frequency or high output power is large. The thickness of the semiconductor substrate 2 of such a semiconductor chip 1 should be large from the viewpoint of strength and easy handling of the semiconductor chip 1. However, a thick semiconductor substrate 2 causes a degradation in the efficiency of heat radiation. A thin semiconductor substrate 2 is desirable for increasing the output power of the semiconductor chip 1 since generated heat is effectively radiated. However, the aforementioned problem of deformation of the semiconductor chip 1 is accentuated if the semiconductor substrate is thin.

SUMMARY OF THE INVENTION

An object of the present invention is to provide a semiconductor chip in which the above-mentioned problems are obviated and in which curving or twisting of the chip due to a difference of the coefficient of heat expansion between the parts is avoided, thereby making it possible to enhance the efficiency of heat radiation, obtain stable characteristics, achieve reliable handling of the chip, and avoid cracking of the semiconductor chip.

A semiconductor chip according to the present invention comprises a semiconductor substrate, on one main surface of which an active region is formed, and a radiator plate which is bonded to the side opposite to said one main surface of the semiconductor substrate. A recess is formed on the other main surface side so as to dispose the radiator plate therein.

DESCRIPTION OF THE PREFERRED EMBODIMENTS

Figure 1:
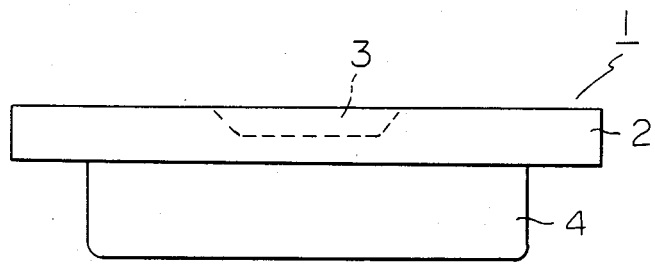
FIG. 1 is a side view of a semiconductor chip to which the present invention can be applied.
Figure 2A:
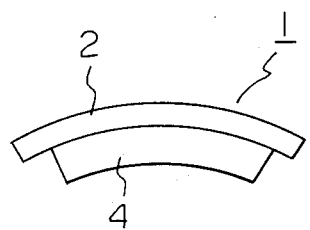
FIGS. 2A and 2B are side views of the semiconductor chip of FIG. 1, showing the deformation of the chip.
Figure 2B:
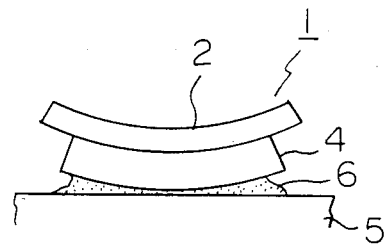
Figure 3:
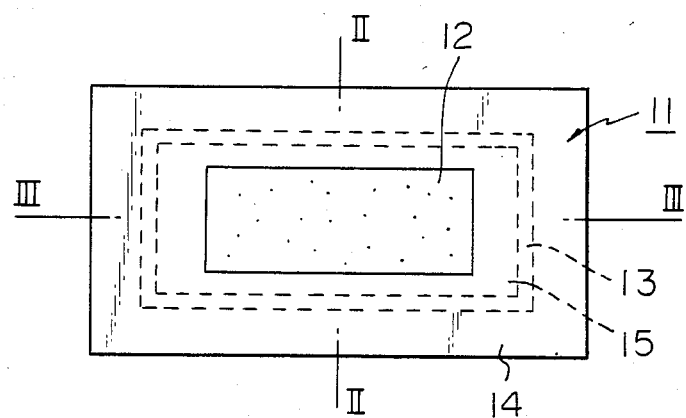
FIG. 3 is a plan view of an embodiment of the semiconductor chip according to the present invention.
Figure 4:
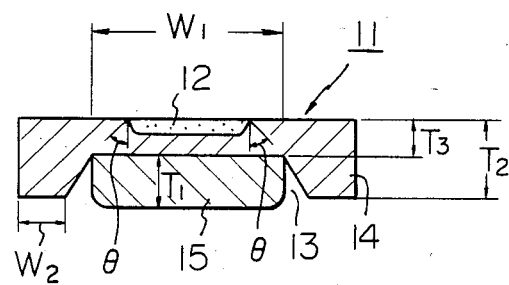
FIG. 4 is a sectional view taken along the line II—II of FIG. 1, being somewhat enlarged for the purpose of illustration.
Figure 5:
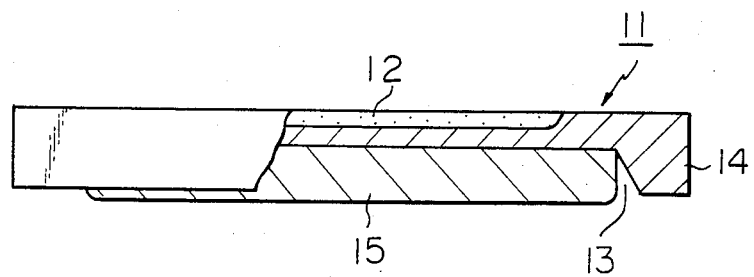
FIG. 5 is a sectional view taken along the line III—III of FIG. 1, being somewhat enlarged for the purpose of illustration.

An embodiment of the present invention is illustrated in FIGS. 3 to 5. Impurities are diffused in the core portion on the upper main surface of a semiconductor substrate 11 of silicon (Si) or gallium-arsenic (GaAs) so as to form an active region 12.

If the semiconductor chip is a bipolar transistor chip, a bipolar PNP or NPN type transistor is formed in the active region 12 the silicon semiconductor substrate is used as a collector region. An overlay type transistor or a mesh emitter type transistor is formed by electrically connecting a plurality of bipolar transistor units in parallel so as to enhance the output power.

If the semiconductor chip is a MIS type transistor chip or Junction type field effect transistor chip, a field effect transistor of high output power is formed by electrically connecting a plurality of field effect transistor units in parallel, in which transistor the silicon semiconductor substrate is used as the source or drain region.

If the semiconductor chip is a Schottky barrier type field effect transistor chip, a field effect transistor of high output power is formed by electrically connecting a plurality of Schottky barrier field effect transistor units in parallel in which transistor the active layer is defined by the active region 12 of, e.g., N type silicon formed in the semiconductor substrate of Ga-As.

Therefore, if the semiconductor chip is the above-mentioned bipolar transistor chip, the metal radiator plate constitutes the collector electrode. If the semiconductor chip is the above-mentioned field effect transistor chip, the metal radiator plate constitutes the source or drain electrode.

A metal electrode layer and an insulation layer are formed on the upper surface of the active region 12 in the semiconductor substrate 11. However, such layers are not illustrated in the drawings.

A recess 13 is formed on the lower main surface side of the semiconductor substrate 11. The size of the recess 13 corresponds to the size of the active region 12. The recess 13 is defined by a thickened portion 14 formed along all of the edges of the rectangular substrate 11 in order to reinforce the semiconductor substrate. It is preferable that the thickened portion 14 have an inclined inside surface in order to enhance the strength thereof. A radiator plate 15, made of a metal of high heat conductivity, such as silver (Ag) or copper (Cu), is bonded to the bottom surface of the recess 13 by means of soldering through a thin metallic film (not shown). The width $W_1$ of the radiator plate 15 is determined in such a manner that the end of the radiator plate 15 is located so that the angle $\theta$ is between 30° and 70°. $\theta$ is the angle between a line perpendicular to the upper surface of the semiconductor substrate 11 at the end of the active region 12 and a line from the same end of the active region 12 to the end of the radiator plate 15. Generated heat is effectively radiated when the angle $\theta$ is between 30° and 70°. It is advantageous to determine the length of the radiator plate 15 in the above manner.

With the above-mentioned structure of the semiconductor chip, the efficiency of heat radiation can be upgraded by thinning the thickness $T_3$ of the semiconductor substrate 11 under the active region 12 without a resultant curving or twisting of the semiconductor chip since the semiconductor substrate 11 is reinforced by the thickened portion 14.

Figure 6:
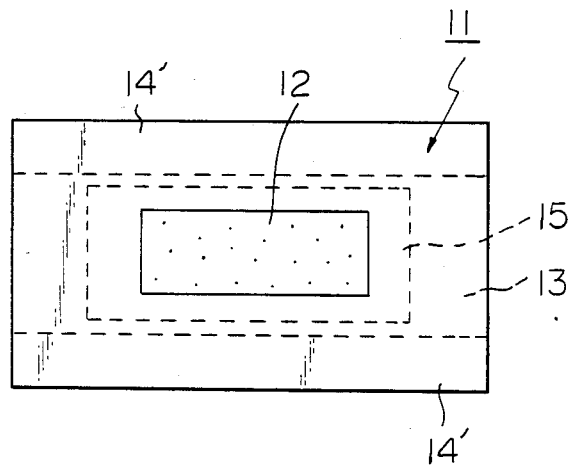
FIG. 6 is a plan view of another embodiment of the semiconductor chip according to the present invention.

Another embodiment of the present invention is illustrated in FIG. 6. In this embodiment, two thickened portions 14' are formed only along the two longitudinal edges of the semiconductor substrate. This structure can be applied to a semiconductor chip in which the length is sufficiently larger than the width or in which the amount of heat generation is small, so that the semiconductor substrate 11 can be thickened while still maintaining a heat radiation effect sufficient for the semiconductor chip.

It was confirmed, in an experiment performed by the present inventors, that curving or twisting of a semiconductor chip does not occur when the present invention is applied. In the experiment: the length of the semiconductor substrate 11 of silicon was 2.2 mm and the width was 1.04 mm; the thickness $T_2$ of the thickened portion thereof was 50 $\mu$m; the thickness $T_3$ of the thinned portion thereof was 20 $\mu$m; the width $W_2$ of the lower surface of the thickened portion thereof was 100 $\mu$m; the active region 12 had a length of 1.8 mm, a width of 0.7 mm, and a depth of 3000 Å; the radiator comprised a silver plate having a length of 1.9 mm, a width of 0.8 mm, and a thickness of 40 $\mu$m; the semiconductor chip was treated by a heat treatment at a temperature of about 380° C., the temperature necessary to bond the radiator plate 15 to the semiconductor substrate 11 and to create an ohmic contact therebetween; and then the semiconductor chip was restored to room temperature.

It was also confirmed that curving or twisting does not occur in a semiconductor chip of the above-mentioned dimension if the semiconductor chip is heated to a temperature of 380° C. for soldering a bonding pad or a stage to the package.

In another experiment, the specimen was a semiconductor chip having the structure illustrated in FIG. 6. The semiconductor substrate 11 consisted of silicon and had a length of 2.5 mm, a width of 1.5 mm, a thickness $T_3$ of the thinned portion of 20 $\mu$m, and a width $W_2$ of the thickened portion 14' of 300 $\mu$m. The experiment was conducted by changing the thickness $T_2$ of the thickened portion 14' and the thickness $T_1$ of the radiator plate 15 of silver under a temperature change of about 400° C. Six specimens were tested in respect to various conditions of $T_1$ and $T_2$.

When $T_2$ was 20 $\mu$m (i.e., when $T_2$ was equal to $T_3$) and $T_1$ was equal to about 42 $\mu$m, deformation occurred in all of the six specimens.

When $T_2$ was equal to 30 $\mu$m and $T_1$ was equal to about 32 $\mu$m, deformation occurred in four specimens.

When $T_2$ was equal to 40 $\mu$m and $T_1$ was equal to about 38 $\mu$m, none of the six specimens were deformed.

When $T_2$ was equal to 50 $\mu$m and $T_1$ was equal to about 37 $\mu$m, none of the six specimens were deformed.

As is apparent from the above results, deformation of the semiconductor chip is effectively prevented when the thickness $T_1$ of the radiator plate is less than the thickness $T_2$ of the thickened portion of the semiconductor substrate.

I claim:

1. A semiconductor chip, comprising:
    a semiconductor substrate having a first surface with an active region formed therein and having a second surface opposite said first surface, with a recess formed therein in a region opposite from said active region, said recess having a bottom surface; and
    a heat radiator plate bonded to said bottom surface of said recess in said second surface of said semiconductor substrate.

2. A semiconductor chip as set forth in claim 1, wherein the coefficient of heat expansion of said semiconductor substrate is different from that of said heat radiator plate.

3. A semiconductor chip as set forth in claim 1, wherein said semiconductor substrate is selected from the group consisting of silicon and gallium-arsenic.

4. A semiconductor chip as set forth in claim 1, wherein said radiator plate is substantially composed of a material selected from the group consisting of copper and silver.

5. A semiconductor chip as set forth in claim 1, wherein said semiconductor substrate has a thickened portion formed along all of the edges of said second surface of said semiconductor substrate, said thickened portions defining said recess.

6. A semiconductor chip as set forth in claim 1, wherein said semiconductor substrate is rectangular and wherein said second surface has two thickened portions formed along the two longitudinal edges of said semiconductor substrate, said thickened portions defining said recess.

7. A semiconductor chip as set forth in claim 5 or 6, wherein the thickness of said radiator plate is less than the thickness of said thickened portion defining said recess.

8. A semiconductor chip as set forth in claim 5 or 6, wherein the surfaces of said thickened portion defining said recess are inclined with respect to said second surface of said semiconductor substrate.

* * * * *